US011515511B2

(12) United States Patent
Li et al.

(10) Patent No.: US 11,515,511 B2
(45) Date of Patent: Nov. 29, 2022

(54) LIGHT-EMITTING DIODE DISPLAY PANEL INCLUDING PLURALITY OF ANNULAR LIGHT-SHIELDING STRUCTURES SURROUNDING SUB-PIXELS, AND MANUFACTURING METHOD THEREOF

(71) Applicant: Beijing BOE Technology Development Co., Ltd., Beijing (CN)

(72) Inventors: Dongsheng Li, Beijing (CN); Kuanta Huang, Beijing (CN); Yunlong Li, Beijing (CN); Shengji Yang, Beijing (CN); Pengcheng Lu, Beijing (CN); Xiaochuan Chen, Beijing (CN); Qing Wang, Beijing (CN); Hui Tong, Beijing (CN); Yongfa Dong, Beijing (CN); Xiaobin Shen, Beijing (CN); Xiong Yuan, Beijing (CN); Yu Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 115 days.

(21) Appl. No.: 16/959,480

(22) PCT Filed: Aug. 23, 2019

(86) PCT No.: PCT/CN2019/102288
§ 371 (c)(1),
(2) Date: Jul. 1, 2020

(87) PCT Pub. No.: WO2021/035401
PCT Pub. Date: Mar. 4, 2021

(65) Prior Publication Data
US 2022/0006062 A1    Jan. 6, 2022

(51) Int. Cl.
*H01L 51/52* (2006.01)
*H01L 27/32* (2006.01)
*H01L 51/56* (2006.01)

(52) U.S. Cl.
CPC ...... *H01L 51/5284* (2013.01); *H01L 27/3218* (2013.01); *H01L 51/56* (2013.01)

(58) Field of Classification Search
CPC . H01L 51/5284; H01L 51/5036; H01L 51/56; H01L 27/3218; H01L 27/322
(Continued)

(56) References Cited

U.S. PATENT DOCUMENTS

2009/0185115 A1    7/2009  Nishida et al.
2015/0362795 A1*  12/2015  Chen ............... G02F 1/133514
                                                         257/40
(Continued)

FOREIGN PATENT DOCUMENTS

CN        106842687 A       6/2017
CN        108121106 A       6/2018
(Continued)

OTHER PUBLICATIONS

Aug. 11, 2022—(EP) Extended European Search Report Appn 19933199.2.

*Primary Examiner* — Matthew E. Gordon
(74) *Attorney, Agent, or Firm* — Banner & Witcoff, Ltd.

(57) ABSTRACT

A light-emitting diode (LED) display panel, a manufacturing method thereof, and an organic light-emitting diode (OLED) display device are disclosed. The LED display panel includes: a base substrate; and a plurality of sub-pixels, a color resistance layer and a light-shielding structure located on the base substrate. The base substrate includes a display region and a periphery region; the sub-pixels are located in the display region; the light-shielding structure is an annular
(Continued)

structure located in the periphery region. The light-shielding structure includes a first light-shielding structure and a second light-shielding structure located at a side of the first light-shielding structure away from the base substrate, a second orthographic projection of the second light-shielding structure on the base substrate is located within a first orthographic projection of the first light-shielding structure on the base substrate, and the first orthographic projection is not completely coincident with the second orthographic projection.

16 Claims, 8 Drawing Sheets

(58) Field of Classification Search
USPC .......................................................... 257/40
See application file for complete search history.

(56) References Cited

U.S. PATENT DOCUMENTS

2016/0079311 A1     3/2016   Lim et al.
2019/0361291 A1*   11/2019   Wang ................. G02F 1/133512
2021/0026046 A1*    1/2021   Shim ....................... G02B 5/003

FOREIGN PATENT DOCUMENTS

CN           108878687 A *   11/2018   ......... H01L 27/3244
CN           108878687 A     11/2018

* cited by examiner

LIGHT-EMITTING DIODE DISPLAY PANEL INCLUDING PLURALITY OF ANNULAR LIGHT-SHIELDING STRUCTURES SURROUNDING SUB-PIXELS, AND MANUFACTURING METHOD THEREOF

TECHNICAL FIELD

This application is a U.S. National Phase Entry of International Application No. PCT/CN2019/102288 filed on Aug. 23, 2019, designating the United States of America. The present application claims priority to and the benefit of the above-identified application and the above-identified application is incorporated by reference herein in its entirety.

BACKGROUND

At present, usually, Si-based active matrix organic light-emitting diode (AMOLED) color display is realized by adopting white organic light-emitting diode (WOLED) in cooperation with color filter (CF). Micro-display incorporated with Si-based AMOLED possesses broad market application space, and is especially applicable for helmet-mounted display, auto-stereoscopic display mirror, eyeglass display and the like.

SUMMARY

At least one embodiment of the present disclosure relates to a light-emitting diode display panel, a manufacturing method thereof and an organic light-emitting diode display device. The light-emitting diode (LED) display panel includes: a base substrate including a display region and a periphery region surrounding the display region; and a plurality of sub-pixels located in the display region and located at a side of the base substrate. At least one sub-pixel of the plurality of sub-pixels includes: a light-emitting element including a first electrode, a light-emitting functional layer and a second electrode that are sequentially laminated, the first electrode is closer to the base substrate as compared to the second electrode; and a driver circuit located between the light-emitting element and the base substrate, the driver circuit includes a driving transistor and a storage capacitor, the driving transistor includes a source electrode, a drain electrode and a gate electrode, one of the source electrode and the drain electrode is coupled with the first electrode, the gate electrode is coupled with the storage capacitor, and the storage capacitor is configured to store a digital signal. The LED display panel further includes: a color resistance layer located at a side of the second electrode away from the base substrate, light emitted from the light-emitting element exits through the color resistance layer; and a light-shielding structure, located in the periphery region and having an annular structure surrounding the plurality of sub-pixels. The light-shielding structure includes a first light-shielding structure and a second light-shielding structure, the second light-shielding structure is located at a side of the first light-shielding structure away from the base substrate, a second orthographic projection of the second light-shielding structure on the base substrate is located within a first orthographic projection of the first light-shielding structure on the base substrate, and the first orthographic projection is not completely coincident with the second orthographic projection.

In some examples, at least part of an edge of the first light-shielding structure is not covered by the second light-shielding structure.

In some examples, both an inner edge and an outer edge of the first light-shielding structure are not covered by the second light-shielding structure.

In some examples, an outer contour of the first light-shielding structure includes a first side extending along a first direction and a second side extending along a second direction, the first direction is intersected with the second direction, the first side is connected with the second side through a cambered side, and the cambered side is curved towards a direction away from the display region.

In some examples, the cambered side includes a rounded angle, and the outer contour of the first light-shielding structure is a rectangle with rounded angles.

In some examples, a circle including the cambered side is tangent with the first side or the second side.

In some examples, a shape of the first light-shielding structure is a closed annulus.

In some examples, a shape of the second light-shielding structure is a closed annulus.

In some examples, a shape of the second light-shielding structure is as same as a shape of the first light-shielding structure, and an area of the second orthographic projection is smaller than an area of the first orthographic projection.

In some examples, the color resistance layer includes a plurality of color resistance sub-layers, the plurality of color resistance sub-layers are in one-to-one correspondence with the plurality of sub-pixels, at least part of adjacent ones of the plurality of color resistance sub-layers are not overlapped with each other, the plurality of color resistance sub-layers include a plurality of first color resistance sub-layers, and the plurality of first color resistance sub-layers and the first light-shielding structure are located in a same layer and are made of a same material.

In some examples, the plurality of color resistance sub-layers further include a plurality of second color resistance sub-layers, the plurality of second color resistance sub-layers and the second light-shielding structure are located in a same layer and are made of a same material.

In some examples, the light-shielding structure further includes a third light-shielding structure, the third light-shielding structure is located at a side of the second light-shielding structure away from the first light-shielding structure.

In some examples, an orthographic projection of the first light-shielding structure on the base substrate is located within an orthographic projection of the third light-shielding structure on the base substrate.

In some examples, an orthographic projection of the third light-shielding structure on the base substrate is located within an orthographic projection of the second light-shielding structure on the base substrate.

In some examples, the plurality of color resistance sub-layers further include a plurality of third color resistance sub-layers, the plurality of third color resistance sub-layers and the third light-shielding structure are located in a same layer and are made of a same material.

In some examples, the first color resistance sub-layer, the second color resistance sub-layer and the third color resistance sub-layer are color filter layers of different colors.

In some examples, the light-shielding structure covers part of the second electrode.

In some examples, the LED display panel further includes: a sensing region located in the periphery region, and an orthographic projection of the sensing region on the base substrate is located within an orthographic projection of the first light-shielding structure on the base substrate.

In some examples, the base substrate is a Si-based substrate.

In some examples, at least part of the driving transistor is located in the Si-based substrate.

In some examples, a side of the color resistance layer facing the base substrate is provided with a first film encapsulation layer, and a side of the color resistance layer away from the base substrate is provided with a second film encapsulation layer.

At least one embodiment of the present disclosure provides a manufacturing method of the LED display panel described above, including: providing the base substrate; forming the light-emitting element in the display region on the base substrate; coating a first color resistance material on the light-emitting element by a spin-coating method; patterning the first color resistance material to form a first color resistance layer in the display region and form the first light-shielding structure surrounding the display region in the periphery region; coating a second color resistance material on the first color resistance layer and on the first light-shielding structure by the spin-coating method; and patterning the second color resistance material to form a second color resistance layer in the display region and form the second light-shielding structure surrounding the display region in the periphery region, at least part of the second color resistance layer is not overlapped with the first color resistance layer. Forming the second light-shielding structure includes: patterning the second color resistance material to allow the second orthographic projection to be located within the first orthographic projection and to allow the first orthographic projection to be not completely coincident with the second orthographic projection.

In some examples, forming the first light-shielding structure includes: patterning the first color resistance material to allow an outer contour of the first light-shielding structure to include a first side extending along a first direction and a second side extending along a second direction, the first direction is intersected with the second direction, the first side is connected with the second side through a cambered side, and the cambered side is curved towards a direction away from the display region.

At least one embodiment of the present disclosure provides an organic light-emitting diode (OLED) display device, including the LED display panel described in any of the examples above.

BRIEF DESCRIPTION OF THE DRAWINGS

In order to clearly illustrate the technical solutions of the embodiments of the disclosure, the drawings of the embodiments will be briefly described in the following; it is obvious that the described drawings below are only related to some embodiments of the disclosure and thus are not limitative to the disclosure.

DETAILED DESCRIPTION

Figure 1:
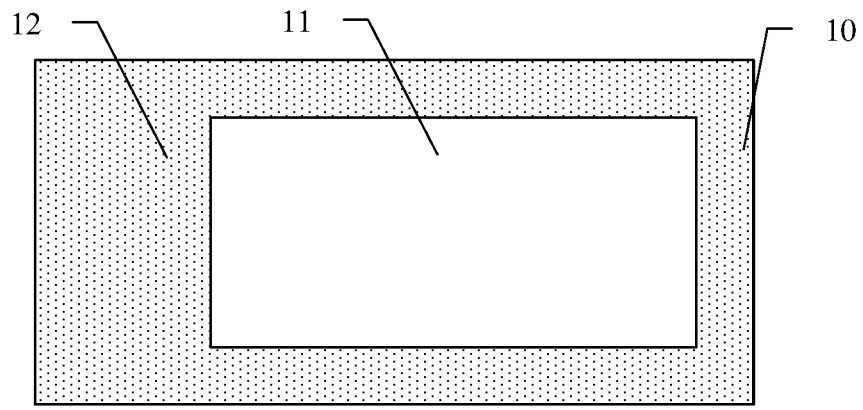
FIG. 1 is a partial structural diagram of a color filter structure in a Si-based organic light-emitting diode (OLED) display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the present disclosure provide a light-emitting diode (LED) display panel, a manufacturing method thereof and an organic light-emitting diode (OLED) display device. The LED display panel includes: a base substrate, a plurality of sub-pixels located on the base substrate, and a color resistance layer and a light-shielding structure that are located at a side of the plurality of sub-pixels away from the base substrate. The base substrate includes a display region and a periphery region surrounding the display region; the plurality of sub-pixels are located in the display region. At least one sub-pixel of the plurality of sub-pixels includes: a light-emitting element including a first electrode, a light-emitting functional layer and a second electrode that are sequentially laminated, the first electrode is closer to the base substrate as compared to the second electrode; and a driver circuit located between the light-emitting element and the base substrate, the driver circuit includes a driving transistor and a storage capacitor, the driving transistor includes a source electrode, a drain electrode and a gate electrode, one of the source electrode and the drain electrode is coupled with the first electrode, the gate electrode is coupled with the storage capacitor, and the storage capacitor is configured to store a digital signal. The color resistance layer is located at a side of the second electrode away from the base substrate, light emitted from the light-emitting element exits through the color resistance layer. The light-shielding structure is located in the periphery region and has an annular structure surrounding the plurality of sub-pixels. The light-shielding structure includes a first light-shielding structure and a second light-shielding structure, the second light-shielding structure is located at a side of the first light-shielding structure away from the base substrate, a second orthographic projection of the second light-shielding structure on the base substrate is located within a first orthographic projection of the first light-shielding structure on the base substrate, and the first orthographic projection is not completely coincident with the second orthographic projection. In the embodiments of the present disclosure, by designing a distance between an inner annulus and an outer annulus of the second light-shielding structure to be smaller than a distance between an inner annulus and an outer annulus of the first light-shielding structure so as to form a stepped structure, it facilitates the flow of the color resistance material during forming subsequent color resistance layer(s) by a spin-coating method, so as to further improve the uniformity of the color resistance layer formed in the display region, and to prevent from the occurrence of non-uniform display in the subsequent display period.

Hereinafter, the LED display panel, the manufacturing method thereof and the OLED display device provided by the embodiments of the present disclosure will be described in connection with the drawings.

FIG. 1 is a partial structural diagram of a color filter structure in a Si-based organic light-emitting diode (OLED) display panel provided by an embodiment of the present disclosure. As illustrated in FIG. 1, the OLED display panel includes a display region 11 and a periphery region 12 surrounding the display region 11; a color filter structure 10 includes a color resistance layer (not illustrated) located in the display region 11 and an annular-shaped light-shielding structure located in the periphery region 12. The light-shielding structure is configured to cover elements in the periphery region 12 of the display panel, for example, anode wirings for connecting light-emitting elements of the display panel, pixel sensing circuits and the like, so as to prevent from the occurrence of light reflection or light leakage in the periphery region.

In order to achieve better shielding effect in the periphery region of the Si-based OLED display panel, the light-shielding structure may include at leas two layers of color filter laminated layers. In the case where the light-shielding structure includes two layers or three layers of color filter laminated layers, a thickness of the light-shielding structure in the periphery region is 2-3 times of that of a pixel color filter in the display region, which may result in a circle of barrier wall to be formed around the display region.

Figure 2A:
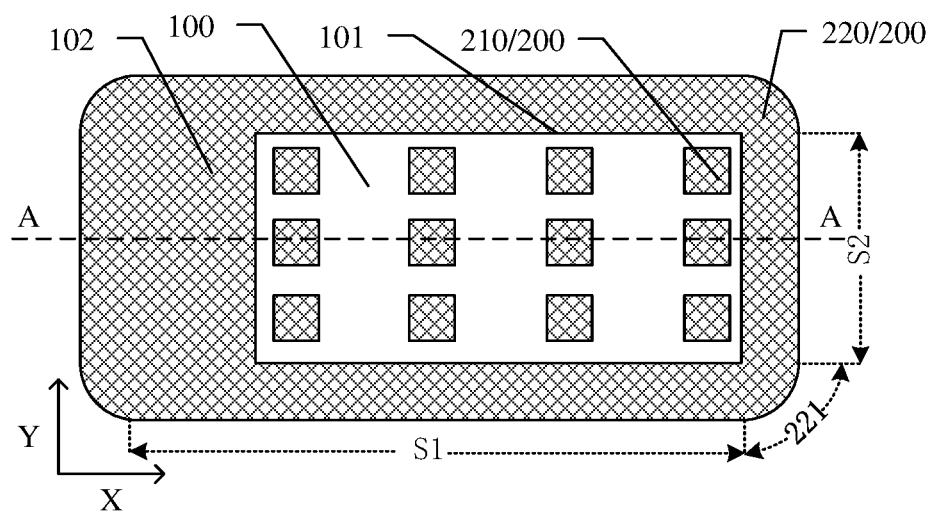
FIGS. 2A-2H are schematic diagrams of a color filter structure provided by an embodiment of the present disclosure.
Figure 2B:
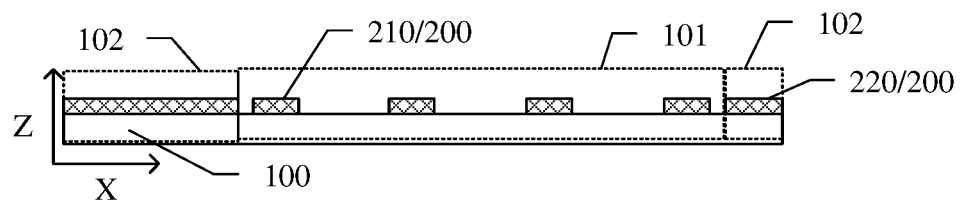

FIGS. 2A-2H are schematic diagrams of a color filter structure provided by an embodiment of the present disclosure. FIG. 2A is a plan structural diagram of a first color filter layer, and FIG. 2B is a sectional structural diagram of the first color filter layer taken along AA line of FIG. 2A. As illustrated in FIG. 2A and FIG. 2B, the color filter structure includes: a transparent base layer 100 and a first color filter layer 200 located on the transparent base layer 100. The transparent base layer 100 includes a display region 101 and a periphery region 102 surrounding the display region 101. For example, the display region 101 is a region configured to display an image, i.e., a light exiting region; the periphery region 102 is a region that does not display an image, i.e., a non-light exiting region.

As illustrated in FIG. 2A and FIG. 2B, the first color filter layer 200 includes a first pixel color filter 210 located in the display region 101 and a first frame color filter 220 located in the periphery region 102. The first frame color filter 220 is an annular-shaped color filter surrounding the display region 101, and is configured to cover structures in the periphery region of the display panel including the color filter structure, for example, wirings for connecting light-emitting elements, and to cover sensing circuit structures or the like (the sensing circuit structure may be connected to a temperature sensor) configured to detect the current of pixels in the sensing region, so as to prevent from light reflection or light leakage in the periphery region. That is to say, the LED display panel provided by the embodiment of the present disclosure includes a color resistance layer located in the display region 101, the color resistance layer includes a plurality of color resistance sub-layers, the plurality of color resistance sub-layers are in one-to-one correspondence with the plurality of sub-pixels, at least part of adjacent ones of the plurality of color resistance sub-layers are not overlapped with each other, the plurality of color resistance sub-layers include a plurality of first color resistance sub-layers. Hereinafter, the embodiments of the present disclosure will be described with reference to the case where the first color resistance sub-layer is the first pixel color filter 210, and the first light-shielding structure included in the LED display panel is the first frame color filter 220, by way of example. For example, the plurality of first color resistance sub-layers and the first light-shielding structure are located in a same layer and are made of a same material. The term "located in a same layer" used here and appeared in the following refers to a relationship between several film layers formed from a same material by a same step (e.g., a one-step patterning process). The term "located in a same layer" used here is not intended to always indicate that the several film layers have a same thickness or have a same height in the sectional views.

In some examples, as illustrated in FIG. 2A, an outer contour of the first light-shielding structure 220 includes a first side Si extending along a first direction (i.e., the X direction) and a second side S2 extending along a second direction (i.e., the Y direction), the first direction is intersected with the second direction, the first side S1 is connected with the second side S2 through a cambered side 221, and the cambered side 221 is curved towards a direction away from the display region 101. For example, both the first side and the second side are straight sides.

In some examples, as illustrated in FIG. 2A and FIG. 2B, at least one angle of an outer contour of the first frame color filter 220 (i.e., the first light-shielding structure) may be a rounded angle 221. A shape of the outer contour of the first frame color filter 220 refers to a shape of an outer frame of an annular-shaped first frame color filter 220.

Compared to the light-shielding structure having an outer frame including a sharp angle as illustrated in FIG. 1, the embodiment of the present disclosure designs at least one angle of an outer annulus of the first frame color filter as a cambered side, so that during the subsequent process of forming other color filter layers, the probability that a color filter material dropped onto an outer side of the first frame color filter presents a divergent shape during the spin-coating process due to an influence of the sharp angle of the outer frame of the first frame color filter is reduced, so as to allow the color filter layer coated in the display region to be more uniform, thereby preventing from the occurrence of non-uniform display in the display device including the color filter structure.

For example, all the angles of the outer annulus (i.e., the outer contour) of the first frame color filter 220 are rounded angles, so that in the subsequent process of forming other color filter layers, the color filter material dropped onto the outer side of the first frame color filter would not present a divergent shape due to the influence of the sharp angle of the outer frame of the first frame color filter, thereby further improving the uniformity of the color filter layer coated in the display region.

In some examples, as illustrated in FIG. 2A, the outer annulus of the first frame color filter 220 is a rounded-angle rectangle, that is, the outer annulus of the first frame color filter 220 is a rectangle having four angles which are all rounded angles. The inner annulus of the first frame color filter 220 is determined according to the shape of the display region 101 as actually demanded, for example, it may be a right-angle rectangle, i.e., the inner annulus of the first frame color filter 220 is a rectangle having four angles which are all right angles.

In some examples, as illustrated in FIG. 2A, a circle including a rounded angle 221 is tangent with a first side or a second side connected with the rounded angle 221 so as to facilitate the manufacture. The circle including the rounded angle 221 being tangent with a straight side may prevent a sharp angle from negatively affecting a coating process of colored photoresists. Moreover, the greater the curvature radius of the rounded angle 221 is, the more advantageous for improving the uniformity of the color filter layer located in the display region will be. However, an increased curvature radius of the rounded angle 221 may result in smaller light-shielding regions at four rounded angles of the frame color filter. Therefore, under the circumstance of ensuring that the underlying wirings are covered, a greater curvature radius of the rounded angle would be better.

In some examples, as illustrated in FIG. 2A, a shape of the first frame color filter 220 is a closed annulus. That is to say, the first frame color filter is a continuous, annular-shaped light-shielding layer which covers the periphery region, so as to prevent the structures in the periphery region of the display panel, including the color filter structure, from reflecting light, thereby achieving a better anti-reflecting effect.

For example, as illustrated in FIG. 2A and FIG. 2B, the first pixel color filter 210 located in the display region 101 includes a plurality of first sub-pixel color filters (i.e., a plurality of first color resistance sub-layers) arranged in an array, and a space is provided between adjacent first sub-pixel color filters so as to subsequently form pixel color filters of different colors. In the embodiment of the present disclosure, the first pixel color filter located in the display region is configured to be right opposite to the light-emitting element in the display panel so as to perform color filtering function on the white light emitted by the light-emitting element.

Figure 2C:
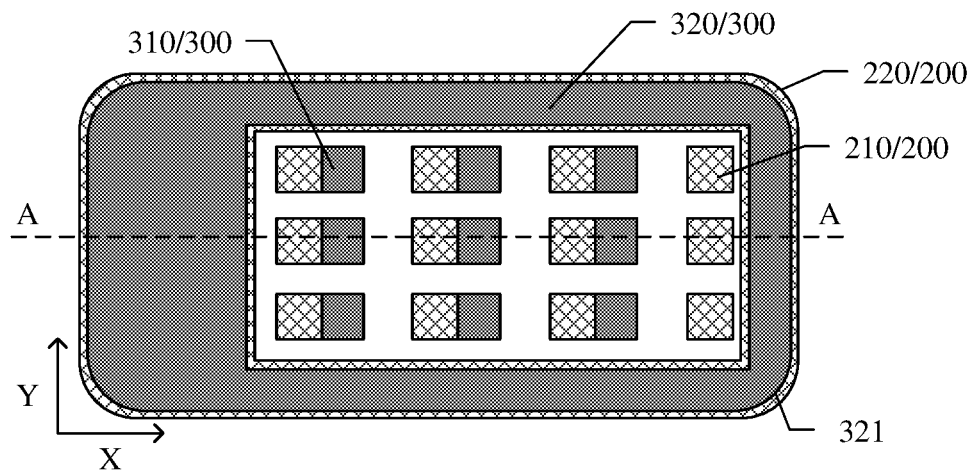
Figure 2D:
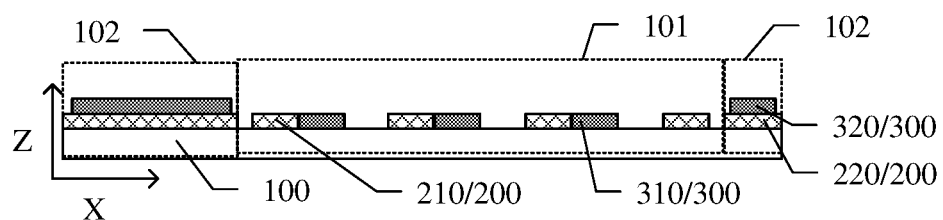

FIG. 2C is a plan structural diagram of a second color filter layer, and FIG. 2D is a sectional structural diagram of the second color filter layer taken along AA line of FIG. 2C. As illustrated in FIG. 2C and FIG. 2D, the color filter structure further includes a second color filter layer 300. The second color filter layer 300 includes: a second pixel color filter 310 located in the display region 101, at least part of the second pixel color filter 310 is not overlapped with the first pixel color filter 210; and a second frame color filter 320 located in the periphery region 102. That is, the light-shielding structure further includes a second light-shielding structure, and the plurality of color resistance sub-layers further include a plurality of second color resistance sub-layers. Hereinafter, the embodiments of the present disclosure will be described with reference to the case where the second pixel color filter 310 is the second color resistance sub-layer, and the second frame color filter 320 is the second light-shielding structure, by way of example. For example, the plurality of second color resistance sub-layers and the second light-shielding structure are located in a same layer and are made of a same material. That is to say, the second color resistance sub-layer and the second light-shielding structure are two film layers formed by a same patterning process performed to a second color resistance material.

FIG. 2C and FIG. 2D illustrate that the second pixel color filter 310 is connected with the first pixel color filter 210, without limited thereto. For example, the second pixel color filter may also be partly overlapped with the first pixel color filter, and an overlapped portion of the first pixel color filter and the second pixel color filter may serve for light-shielding so as to save a black matrix. For example, the second pixel color filter may also be separated from the first pixel color filter, and a space between the first pixel color filter and the second pixel color filter may be provided with a black matrix so as to prevent from crosstalk.

For example, as illustrated in FIG. 2C and FIG. 2D, the second pixel color filter 310 includes a plurality of second sub-pixel color filters (i.e., a plurality of second color resistance sub-layers), at least part of the second sub-pixel color filter is not overlapped with the first sub-pixel color filter, one side of the second sub-pixel color filter may be connected with the first sub-pixel color filter and the other side of the second sub-pixel color filter may have a certain distance from the first sub-pixel color filter so as to subsequently form pixel color filters having a color different from both the first pixel color filter and the second pixel color filter. Of course, the embodiments of the present disclosure are not limited thereto, and the first sub-pixel color filter may be alternately arranged with the second sub-pixel color filter and also connected with the second sub-pixel color filter.

As illustrated in FIG. 2C, the second frame color filter 320 is an annular-shaped color filter layer surrounding the display region 101, for example, a closed, annular-shaped color filter layer. The second frame color filter 320 is located at a side of the first frame color filter 220 away from the transparent base layer 100 so as to be overlapped with the first frame color filter 220, thereby serving for light-shielding and anti-light reflecting together with the first frame color filter.

For example, as illustrated in FIG. 2C, when an angle of the outer contour of the first frame color filter 220 is a rounded angle, during the process of forming the second color filter layer 300 by using the spin-coating method, the thickness of the second pixel color filter 310 spin-coated in the display region 101 is relatively uniform, so as to prevent from the occurrence of non-uniform display in the subsequent display period.

In some examples, as illustrated in FIG. 2C, a shape of the second frame color filter 320 may be as same as a shape of the first frame color filter 220. That is, the outer contour of the second frame color filter 320 includes a cambered side 321 located at an included angle between the first side and the second side, so that during the process of subsequently forming color filter layers by using a spin-coating method, the color filter layer spin-coated in the display region has better uniformity. When the inner annulus of the first frame color filter is configured to define a shape of the display region, the shape of the inner annulus of the second frame color filter is not limited. For example, the shape of the inner annulus of the second frame color filter may be a right-angle rectangle, and may also be a rounded-angle rectangle.

In some examples, as illustrated in FIG. 2C and FIG. 2D, an orthographic projection of the second frame color filter 320 on the transparent base layer 100 is located within an orthographic projection of the first frame color filter 220 on the transparent base layer 100; and along a direction from a center of the display region 101 to the periphery region, a size of the first frame color filter 220 is greater than a size of the second frame color filter 320 so as to form a stepped structure. A distance between the inner annulus and the outer annulus of the first frame color filter 220 is greater than a distance between the inner annulus and the outer annulus of the second frame color filter 320 to form a stepped structure. That is, referring to the plan view illustrated in FIG. 2C, a second orthographic projection of the second light-shielding structure 320 on the transparent base layer 100 is located within a first orthographic projection of the first light-shielding structure 220 on the transparent base layer 100, and the first orthographic projection is not completely coincident with the second orthographic projection. For example, an area of the second orthographic projection is smaller than an area of the first orthographic projection.

Compared to the case where the size of the first frame color filter is exactly the same with the size of the second frame color filter, in the embodiments of the present disclosure, the distance between the inner annulus and the outer annulus of the second frame color filter is designed to be smaller than the distance between the inner annulus and the outer annulus of the first frame color filter so as to form a stepped structure, which can facilitate the flow of the color filter material during the process of forming subsequent color filter layers by using a spin-coating method, thereby further improving the uniformity of the pixel color filters formed in the display region and preventing from the occurrence of non-uniform display during the subsequent display period.

In some examples, as illustrated in FIG. 2C, at least part of an edge of the first light-shielding structure 220 is not covered by the second light-shielding structure 320. That is, a portion of the edge of the first light-shielding structure 220 not covered is formed as a stepped structure.

In some examples, as illustrated in FIG. 2C, both an inner edge and an outer edge of the first light-shielding structure 220 are not covered by the second light-shielding structure 320. That is, two circles of stepped structures are formed at positions of the inner contour and outer contour of the first light-shielding structure 220.

For example, the above-mentioned stepped structure may be located at a side of the second frame color filter close to the display region, and may also be located at a side of the second frame color filter away from the display region. Alternatively, the above-mentioned stepped structure may be provided at both the side of the second frame color filter close to the display region and the side of the second frame color filter away from the display region so as to be advantageous for the uniformity of the pixel color filter subsequently formed in the display region.

For example, the first color filter layer 200 and the second color filter layer 300 are two layers of color filter layers having different colors. For example, the first color filter layer 200 and the second color filter layer 300 may be red color filter layer and green color filter layer, respectively; or, red color filter layer and blue color filter layer, respectively; or, green color filter layer and blue color filter layer, respectively; without particularly limited in the embodiments of the present disclosure. That is, the first color resistance sub-layer and the second color resistance sub-layer are two layers of color filter layers having different colors.

Figure 2E:
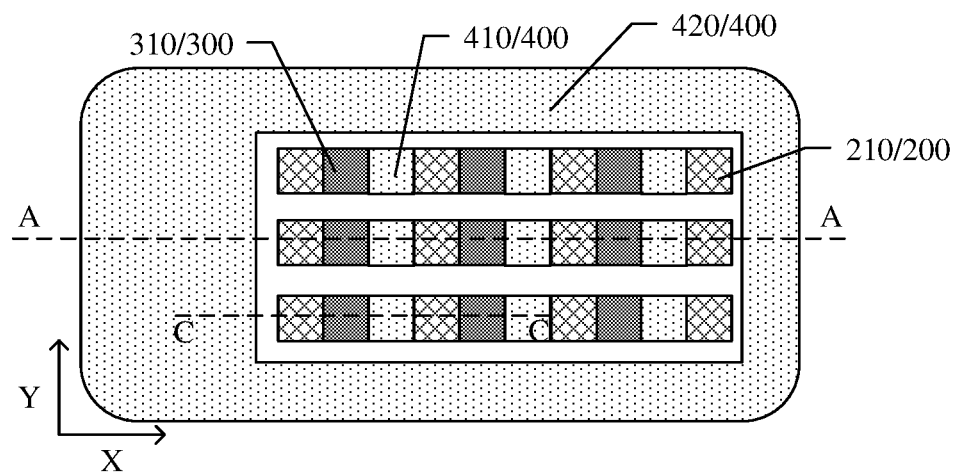
Figure 2F:
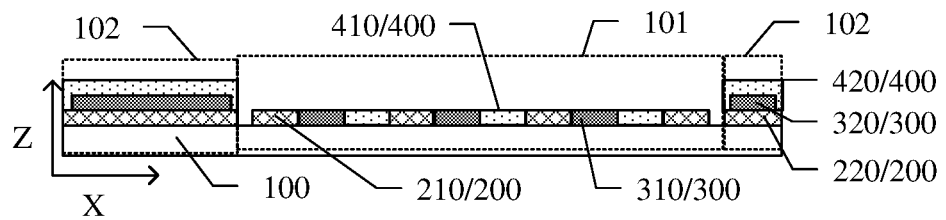

FIG. 2E is a plan structural diagram of a third color filter layer, and FIG. 2F is a sectional structural diagram of the third color filter layer taken along AA line of FIG. 2E. As illustrated in FIG. 2E and FIG. 2F, the color filter structure further includes a third color filter layer 400. The third color filter layer 400 includes: a third pixel color filter 410 located in the display region 101, at least part of the third pixel color filter 410 is not overlapped with the first pixel color filter 210 and the second pixel color filter 310; and a third frame color filter 420 located in the periphery region 102. That is, the light-shielding structure further includes a third light-shielding structure, and the plurality of color resistance sub-layers further include a plurality of third color resistance sub-layers. Hereinafter, the embodiments of the present disclosure will be described with reference to the case where the third frame color filter 420 is the third light-shielding structure, and the third pixel color filter 410 is the third color resistance sub-layer, by way of example. For example, the plurality of third color resistance sub-layers and the third light-shielding structure are located in a same layer and are made of a same material. That is to say, the third color resistance sub-layer and the third light-shielding structure are two film layers formed by a same patterning process performed to a third color resistance material.

FIG. 2E and FIG. 2F illustrate that the third pixel color filter 410 is connected with the first pixel color filter 210 and the second pixel color filter 310, without limited thereto. For example, the third pixel color filter may also be partly overlapped with both the first pixel color filter and the second pixel color filter, and the overlapped portions described above may serve for light-shielding so as to save the black matrix. For example, the third pixel color filter may also be separated from the first pixel color filter and the second pixel color filter, and a space between adjacent pixel color filters may be provided with a black matrix so as to prevent from crosstalk.

For example, as illustrated in FIG. 2E and FIG. 2F, the third pixel color filter 410 includes a plurality of third sub-pixel color filters (i.e., a plurality of third color resistance sub-layers), one side of the third sub-pixel color filter may be connected with the first sub-pixel color filter and the other side of the third sub-pixel color filter may be connected with the second sub-pixel color filter.

As illustrated in FIG. 2E, the third frame color filter 420 is an annular-shaped color filter layer surrounding the display region 101, for example, a closed, annular-shaped color filter layer. The third frame color filter 420 is located at a side of the second frame color filter 320 away from the transparent base layer 100 so as to be overlapped with the second frame color filter 320 and the first frame color filter 220, thereby serving for light-shielding together with the first frame color filter and the second frame color filter. FIG. 2E illustrates that an angle of an outer annulus of the third frame color filter is also a rounded angle, but the embodiments of the present disclosure are not limited thereto, and the angle of the outer annulus of the third frame color filter may also be a sharp angle provided that no subsequent color filter will be formed.

For example, as illustrated in FIG. 2E, when the angle of the outer annulus of the second frame color filter is a rounded angle, during the process of forming the third color filter layer 400 by using the spin-coating method, the thickness of the third pixel color filter 410 spin-coated in the display region 101 is relatively uniform, so as to prevent from the occurrence of non-uniform display in the subsequent display period. Moreover, during the process of forming the third color filter layer by using the spin-coating method, a width of the second frame color filter is designed to be smaller than a width of the first frame color filter so as to form a stepped structure, which can facilitate the flow of the material of the third color filter layer, thereby further improving the uniformity of the third pixel color filter formed in the display region and preventing from the occurrence of non-uniform display during the subsequent display period.

For example, as illustrated in FIG. 2E and FIG. 2F, an orthographic projection of the third frame color filter 420 on the transparent base layer 100 may be completely coincident with the orthographic projection of the first frame color filter 220 on the transparent base layer 100, so as to realize the light-shielding effect in a better way. The embodiments of the present disclosure include such case but are not limited thereto, and the orthographic projection of the first frame color filter on the transparent base layer may also be located within the orthographic projection of the third frame color filter on the transparent base layer. When a size of the third frame color filter is greater than a size of the first frame color filter, an inner contour of the third frame color filter is configured to define the shape of the display region.

In some examples, as illustrated in FIG. 2E and FIG. 2F, the first color filter layer 200, the second color filter layer 300 and the third color filter layer 400 are color filter layers having different colors. For example, these three color filter layers may be red color filter layer, green color filter layer and blue color filter layer, respectively. That is, the first color resistance sub-layer, the second color resistance sub-layer and the third color resistance sub-layer are color filter layers of different colors. For example, the first color resistance sub-layer, the second color resistance sub-layer and the third color resistance sub-layer mentioned above may be red color filter layer, green color filter layer and blue color filter layer, respectively.

Figure 2G:
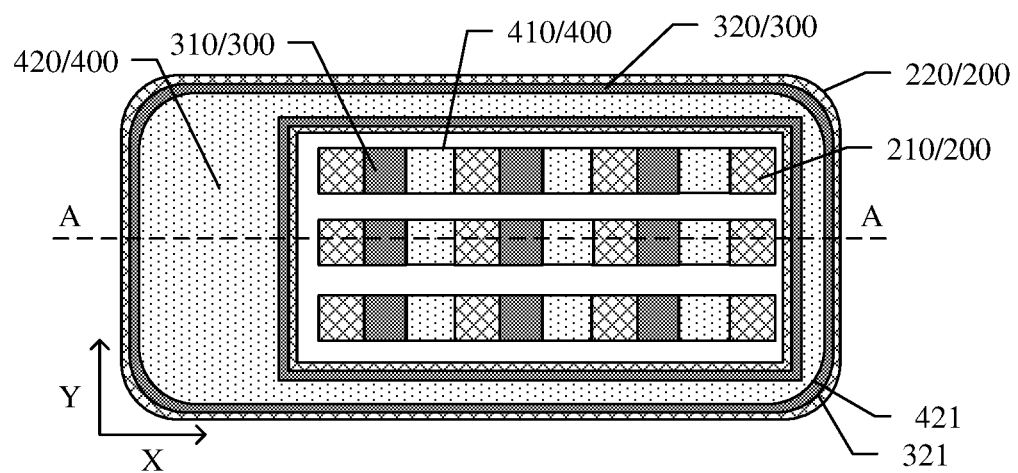
Figure 2H:
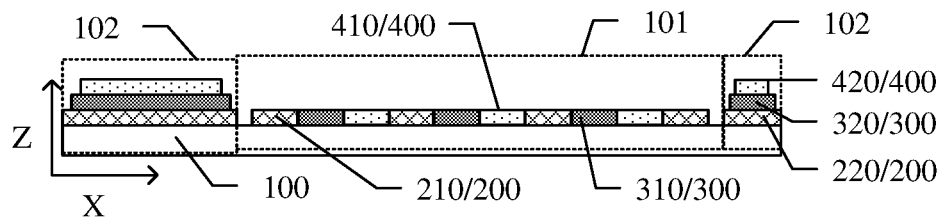

FIG. 2G is a plan structural diagram of a third color filter layer, and FIG. 2H is a sectional structural diagram of the third color filter layer taken along AA line of FIG. 2G. As illustrated in FIG. 2H and FIG. 2G, the orthographic projection of the third frame color filter 420 (the third light-shielding structure 420) on the transparent base layer 100 is located within the orthographic projection of the second frame color filter 320 (the second light-shielding structure 320) on the transparent base layer 100, so as to prevent the light-shielding structure with relatively greater thickness from shielding image light emitted outwardly from the display region.

For example, as illustrated in FIG. 2G, the outer contour of the third light-shielding structure 420 may include a cambered side 421, without limited thereto, as along as the orthographic projection of the third light-shielding structure 420 on the base substrate is located within the orthographic projection of the second light-shielding structure 320 on the base substrate.

FIG. 2H illustrates that a width of the third light-shielding structure 420 along a direction perpendicular to an extension direction of the light-shielding structure is smaller than a width of the second light-shielding structure 320 along the direction perpendicular to the extension direction of the light-shielding structure, without limited thereto. It's also possible that, the orthographic projection of the third light-shielding structure 420 on the transparent base layer 100 is completely coincident with the orthographic projection of the second light-shielding structure 320 on the transparent base layer 100, so as to facilitate the manufacture.

Figure 3A:
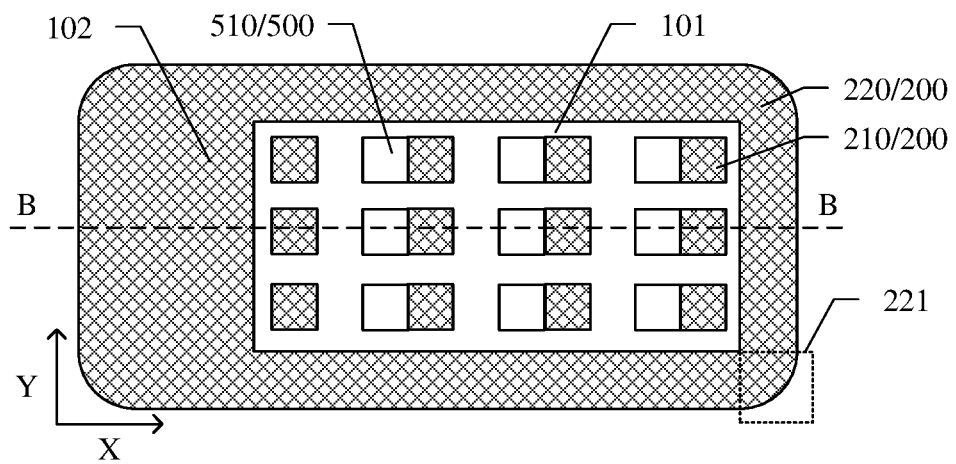
FIGS. 3A-3E are schematic diagrams of a color filter structure provided by another embodiment of the present disclosure.
Figure 3B:
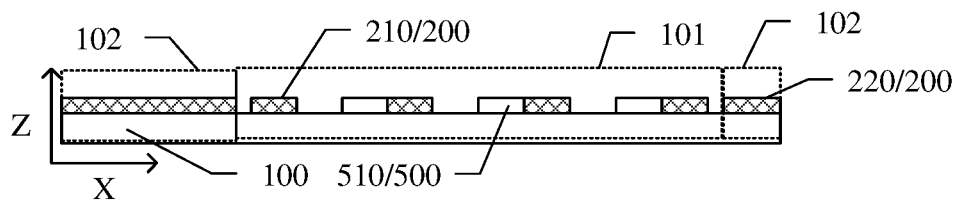

FIGS. 3A-3E are schematic diagrams of a color filter structure provided by another embodiment of the present disclosure. FIG. 3A is a plan structural diagram of a first color filter layer and a fourth color filter layer, and FIG. 3B is a sectional structural diagram of the first color filter layer and the fourth color filter layer taken along BB line of FIG. 3A. As illustrated in FIG. 3A and FIG. 3B, the color filter structure includes a transparent base layer 100 and a first color filter layer 200 located on the transparent base layer 100. The transparent base layer 100 includes a display region 101 and a periphery region 102 surrounding the display region 101.

As illustrated in FIG. 3A and FIG. 3B, the first color filter layer 200 includes a first pixel color filter 210 located in the display region 101 and a first frame color filter 220 located in the periphery region 102. The first frame color filter 220 is an annular-shaped color filter surrounding the display region 101, and is configured to cover structures in the periphery region of the display panel including the color filter structure, for example, wirings for connecting light-emitting elements, and to cover sensing circuit structures or the like (the sensing circuit structure may be connected to a temperature sensor) configured to detect the current of pixels in the sensing region, so as to prevent from light reflection or light leakage in the periphery region.

As illustrated in FIG. 3A and FIG. 3B, the outer annulus of the first frame color filter 220 is a polygon, and at least one angle of the polygon is a rounded angle 221. The outer annulus of the first frame color filter 220 being a polygon refers to that, the outer frame of the annular-shaped first frame color filter is a polygon. The shape and effect of the first frame color filter in the present embodiment are the same with those of the first frame color filter illustrated in FIG. 2A and FIG. 2B, without repeatedly described here.

As illustrated in FIG. 3A and FIG. 3B, the color filter structure further includes a fourth color filter layer 500 which only includes a fourth pixel color filter 510 located in the display region 101, and at least part of the fourth pixel color filter 510 is not overlapped with the first pixel color filter 210. That is, the fourth color filter layer 500 does not include a frame color filter located in the periphery region 102; i.e., in the case where the display region 101 includes pixel color filters of two colors, the periphery region 102 only includes one layer of color filter layer so as to reduce the thickness of the frame color filter in the periphery region. In the present embodiment, the first color filter layer is formed after forming the fourth color filter layer; because the fourth color filter layer does not include a frame color filter, the uniformity of the subsequently formed first color filter layer would not be affected, and the first pixel color filter formed in the display region by adopting the spin-coating method is uniform. The above-described first color filter layer, second color filter layer and fourth color filter layer may be red color filter layer, green color filter layer and blue color filter layer, respectively. Colors of the first color filter layer and the second color filter layer in the present embodiment are as same as those of the first color filter layer and the second color filter layer in the embodiment above, respectively. The color of the fourth color filter layer in the present embodiment may be as same as or different from that of the third color filter layer in the embodiment above. The present embodiment will be described with reference to the case where the color of the fourth color filter layer is as same as that of the third color filter layer in the embodiment above, by way of example.

Figure 3C:
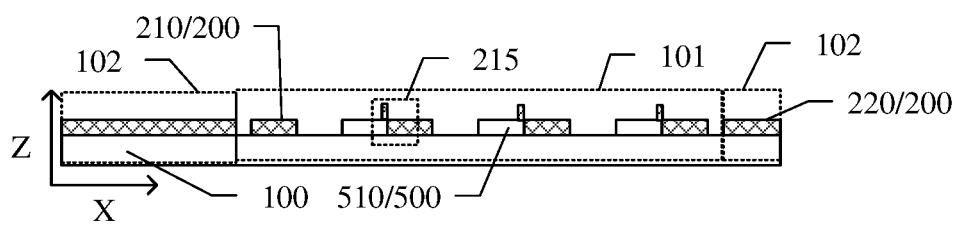

FIG. 3A and FIG. 3B illustrate that the fourth pixel color filter 510 is connected with the first pixel color filter 210, without limited thereto. FIG. 3C is a partial sectional view of a color filter structure provided by another example of the embodiment of the present disclosure. For example, as illustrated in FIG. 3C, the fourth pixel color filter 510 may also be partly overlapped with the first pixel color filter 210, and an overlapped portion of the first pixel color filter and the fourth pixel color filter may serve for light-shielding so as to save a black matrix. For example, as illustrated in FIG. 3C, in the overlapped portion 215 of the fourth pixel color filter 510 and the first pixel color filter 210, the fourth pixel color filter 510 is located at a side of the first pixel color filter 210 close to the transparent base layer 100.

Of course, the embodiments of the present disclosure are not limited to this. For example, the fourth pixel color filter may also be separated from the first pixel color filter, and a space between the first pixel color filter and the fourth pixel color filter may be provided with a black matrix so as to prevent from crosstalk.

Figure 3D:
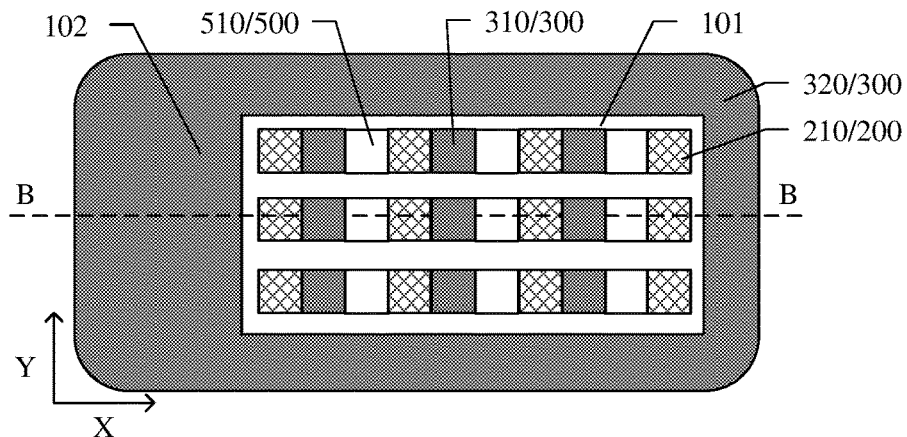
Figure 3E:
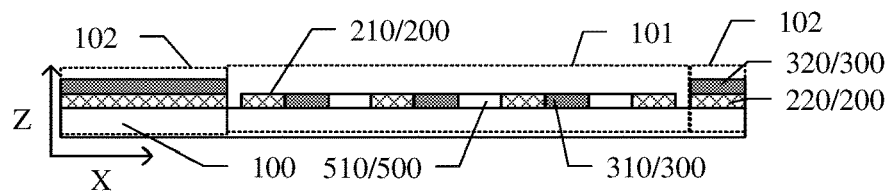

FIG. 3D is a plan structural diagram after forming a second color filter layer, and FIG. 3E is a sectional structural diagram of the second color filter layer taken along BB line of FIG. 3D. As illustrated in FIG. 3D and FIG. 3E, the color filter structure further includes a second color filter layer 300. The second color filter layer 300 incudes: a second pixel color filter 310 located in the display region 101, at least part of the second pixel color filter 310 is not overlapped with the first pixel color filter 210 and the fourth pixel color filter 510; and a second frame color filter 320 located in the periphery region 102. FIG. 3D and FIG. 3E illustrate that the second pixel color filter 310 is connected with the first pixel color filter 210 and the fourth pixel color filter 510, without limited thereto. For example, the second pixel color filter may also be partly overlapped with the first pixel color filter and the fourth pixel color filter, and the overlapped portions above may serve for light-shielding so as to save a black matrix. For example, in the overlapped portion of the second pixel color filter and the fourth pixel color filter, the fourth pixel color filter is located at a side of the second pixel color filter close to the transparent base layer. For example, the second pixel color filter may also be separated from the first pixel color filter and the fourth pixel color filter, and a space between adjacent pixel color filters may be provided with a black matrix so as to prevent from crosstalk.

For example, in the embodiment of the present disclosure, each type of pixel color filter includes a portion that is not overlapped with other pixel color filters.

As illustrated in FIG. 3D, the second frame color filter 320 is an annular-shaped color filter layer surrounding the display region 101, for example, a closed, annular-shaped color filter layer. The second frame color filter 320 is located at a side of the first frame color filter 220 away from the transparent base layer 100 so as to be overlapped with the first frame color filter 220, and the orthographic projection of the first frame color filter 220 on the transparent base layer 100 is located within the orthographic projection of the second frame color filter 320 on the transparent base layer 100; in this way, the second frame color filter and the first frame color filter, together, serve for light-shielding.

For example, as illustrated in FIG. 3D and FIG. 3E, the orthographic projection of the first frame color filter 220 on the transparent base layer 100 is completely coincident with the orthographic projection of the second frame color filter 320 on the transparent base layer 100, so as to facilitate the manufacture.

For example, as illustrated in FIGS. 3A-3E, when the angle of the outer annulus of the first frame color filter 220 is a rounded angle, during the process of forming the second color filter layer 300 by adopting a spin-coating method, the thickness of the second pixel color filter 310 spin-coated in the display region 101 is relatively uniform, so as to prevent from the occurrence of non-uniform display in the subsequent display period.

In some examples, as illustrated in FIG. 3D and FIG. 3E, the first color filter layer 200, the second color filter layer 300 and the fourth color filter layer 400 are color filter layers of different colors. For example, these three color filter layers may be red color filter layer, green color filter layer and blue color filter layer, respectively.

Figure 4:
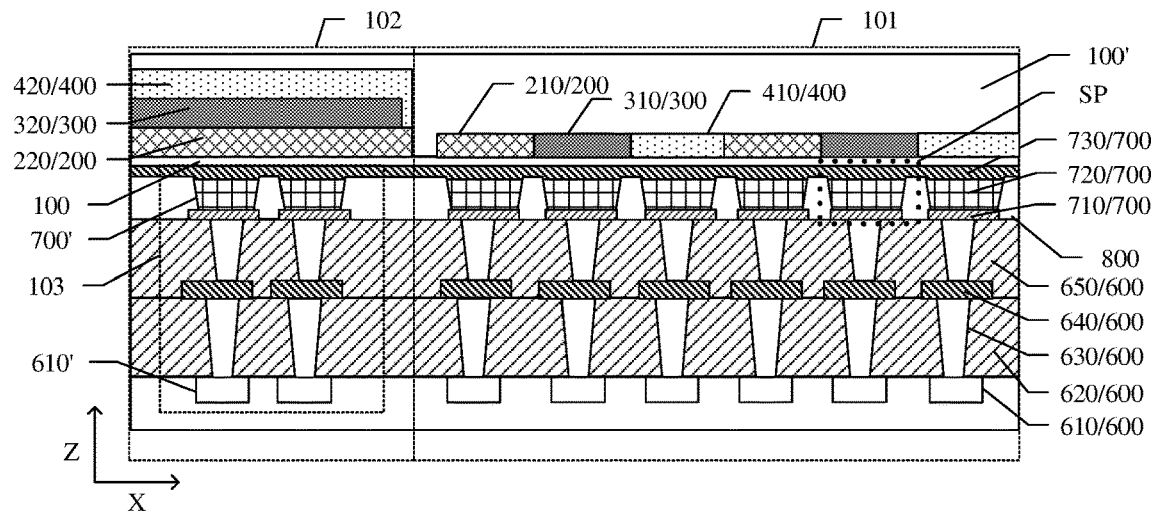
FIG. 4 is a partial sectional view of a light-emitting diode (LED) display panel provided by an embodiment of the present disclosure.

Another embodiment of the present disclosure provides a LED display panel. FIG. 4 is a partial sectional view of a LED display panel provided by an embodiment of the present disclosure. In the case where the embodiment of FIG. 4 includes the color filter structure illustrated in FIG. 2E, by way of example, FIG. 4 is a sectional view of the LED display panel taken along CC line of FIG. 2E, without limited thereto. The LED display panel provided by the embodiments of the present disclosure may also include the color filter structure illustrated in FIG. 3E or the like, as long as in the direction perpendicular to the extension direction of the light-shielding structure, the width of the second light-shielding structure is smaller than the width of the first light-shielding structure so as to form a stepped structure. For example, the LED display panel provided by the embodiment of the present disclosure may include any color filter structure described above.

As illustrated in FIG. 4, the LED display panel includes a base substrate 600, a plurality of sub-pixels located on the base substrate 600, and a color filter structure (e.g., the color resistance layer and the light-shielding structure) located at a display side of the sub-pixels. Hereinafter, description will be given with reference to the case where the color filter structure is as illustrated in FIG. 2E, by way of example.

As illustrated in FIG. 4, the plurality of sub-pixels are located in the display region 101 and are located at a side of the base substrate 600. At least one sub-pixel of the plurality of sub-pixels includes: a light-emitting element 700 and a driver circuit 610 located between the light-emitting element 700 and the base substrate 600. The light-emitting element 700 includes a first electrode 710, a light-emitting functional layer 720 and a second electrode 730 that are sequentially laminated, the first electrode 710 is closer to the base substrate 600 as compared to the second electrode 730. The driver circuit 610 includes a driving transistor and a storage capacitor, the driving transistor includes a source electrode, a drain electrode and a gate electrode, one of the source electrode and the drain electrode is coupled with the first electrode 710, the gate electrode is coupled with the storage capacitor, and the storage capacitor is configured to store a digital signal. The color resistance layer is located at a side of the second electrode 730 away from the base substrate 600, light emitted from the light-emitting element 700 exits through the color resistance layer.

Figure 6:
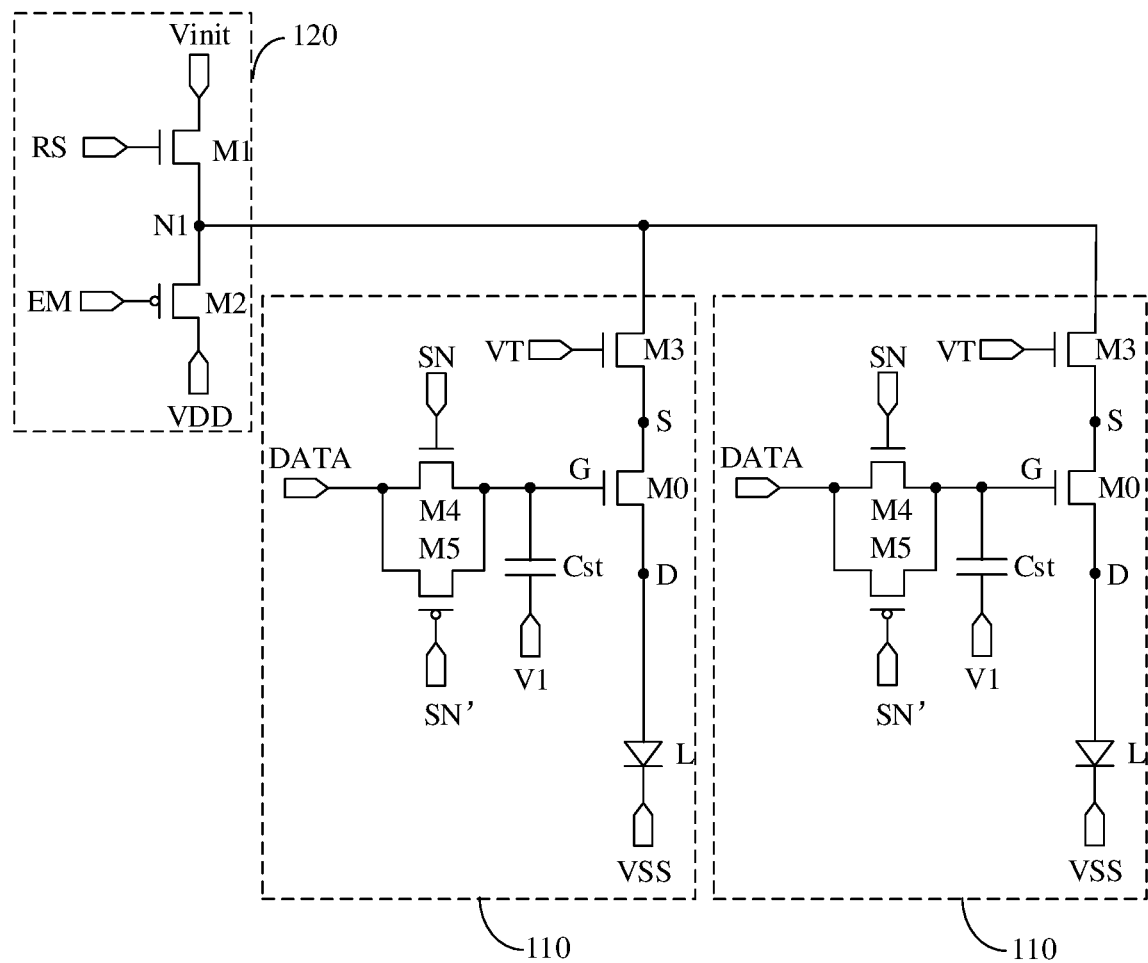
FIG. 6 is a circuit diagram illustrating a voltage control circuit and a pixel circuit provided by an embodiment of the present disclosure.

FIG. 4 merely illustrates a structure of the driver circuit by way of example, and an example of more details of the structure of the driver circuit may be referred to the following description in connection with FIG. 6.

As illustrated in FIG. 4, the LED display panel further includes a sensing region 103 located in the periphery region 102, the sensing region 103 may include a sensing circuit structure (not illustrated) configured to detect a current of the pixel, the sensing circuit structure may be connected to a temperature sensor, and the sensing circuit may be located at a side of the color filter structure facing the base substrate 600. An orthographic projection of the sensing region 103 on the transparent base layer 100 is located within the orthographic projection of the first frame color filter 220 (i.e., the first light-shielding structure) on the transparent base layer 100.

As illustrated in FIG. 4, the second electrode 730 of the light-emitting element 700 in the display region 101 may extend into the sensing region 103; and the first frame color filter 220 (i.e., the first light-shielding structure), the second frame color filter 320 (i.e., the second light-shielding structure) and the third frame color filter 420 (i.e., the third light-shielding structure) cover the second electrode 730 which extends into the sensing region. For example, the sensing region 103 includes a sensing circuit structure 610' and a light-emitting element 700' that is located in the same layer with the light-emitting element 700 of the display region; the above-described first frame color filter 220, second frame color filter 320 and third frame color filter 420, used as light-shielding structures, may block light emitted from the light-emitting element of the sensing region. Moreover, it should be explained that, FIG. 4 merely illustrates structures of first frame color filter 220, second frame color filter 320 and third frame color filter 420 located in the periphery region, by way of example, but the embodiments of the present disclosure are not limited thereto. For example, all of the color filter structures described in the embodiments above may be applied to the structure illustrated in FIG. 4. That is to way, the color filter structure illustrated in FIG. 4 may be replaced by any color filter structure of the embodiments above.

For example, each sub-pixel SP includes a light-emitting element 700, as indicated by the dotted-line box illustrated in FIG. 4. Each sub-pixel corresponds to one color resistance sub-layer, for example, color resistance sub-layer 210, 310, 410 or the like, so that light emitted from each sub-pixel displays a corresponding color after being filtered through a corresponding color resistance layer.

In some examples, as illustrated in FIG. 4, the base substrate 600 is a Si-based substrate 600, a side of the Si-based substrate 600 facing the light-emitting element 700 includes a driver circuit 610, and the driver circuit 610 is connected with the light-emitting element 700. That is, the Si-based substrate 600 is integrated with the driver circuit 610. For example, the Si-based substrate 600 is integrated with the source electrode and the drain electrode of the driving transistor in the driver circuit 610.

For example, the Si-based substrate may also be integrated with a gate driver circuit and a data driver circuit (not illustrated); a periphery region of the Si-based substrate is provided with a flexible circuit board which is configured to output an electrical signal to the gate driver circuit, the data driver circuit and the light-emitting element. For example, the gate driver circuit (not illustrated) is configured to generate a gate driving signal, the data driver circuit (not illustrated) is configured to generate a data signal, and both the gate driver circuit and the data driver circuit may adopt conventional circuit structures in the related art, without particularly limited in the embodiments of the present disclosure.

For example, the driver circuit 610 is configured to provide the light-emitting element 700 with a driving current under the drive of a gate scanning signal, a data signal, a voltage signal or the like, so that an organic light-emitting layer included in the light-emitting element emits light. For example, the driver circuit 610 may adopt a pixel circuit of a circuit structure such as 4T1C, 4T2C, 7T1C, 8T2C and the like, and a driving method thereof may adopt conventional methods in the related art, without repeatedly described here. For example, the pixel circuit structure may be manufactured on the Si-based substrate by adopting a CMOS process, without particularly limited in the embodiments of the present disclosure.

For example, as illustrated in FIG. 4, the Si-based substrate 600 further includes a first insulating layer 620 and a second insulating layer 650 located between the driver circuit 610 and the light-emitting element 700, and a via hole 630 is provided in both of the two insulating layers. For example, the via hole 630 may be a tungsten hole filled with tungsten metal. In the case where both the first insulating layer 620 and the second insulating layer 650 have a greater thickness, forming a tungsten hole in the first insulating layer 620 and the second insulating layer 650 can ensure the stability of the conductive path. Furthermore, because the process of forming the tungsten hole is mature, the first insulating layer 620 and the second insulating layer 650 as obtained have excellent surface flatness, which facilitates to reduce a contact resistance between an electrode included in the light-emitting element 700 and each of the first insulating layer 620 and the second insulating layer 650.

For example, as illustrated in FIG. 4, a metal layer 640 is provided between the via holes 630 in the first insulating layer 620 and the in second insulating layer 650, so as to realize an electrical connection between the light-emitting element 700 and the driver circuit 610.

For example, as illustrated in FIG. 4, the first electrode 710 included in the light-emitting element 700 is electrically connected with the driver circuit 610 through the via hole 630 located in the insulating layer, and the driver circuit 610 is configured to drive the light-emitting element 700 to emit light. The light-emitting element 700 includes a plurality of light-emitting sub-elements, and light-emitting functional layers 720 of adjacent light-emitting sub-elements are spaced apart through a pixel definition layer 800.

For example, the driver circuit 610 at least includes a driving transistor and a switching transistor (not illustrated in FIG. 4, referring to FIG. 6), and the driving transistor is electrically connected with the first electrode 710. In this way, an electrical signal that drives the light-emitting element 700 is transmitted to the first electrode 710, so as to control the light-emitting element 700 to emit light. For example, the driving transistor includes a gate electrode, a source electrode and a drain electrode. The source electrode of the driving transistor is electrically connected with the first electrode 710. When the driving transistor is in a turned-on state, an electrical signal provided by a power source line may be transmitted to the first electrode 710 through the source electrode of the driving transistor. Because a voltage difference is generated between the first electrode 710 and the second electrode 730, an electrical field is formed there-between, and the light-emitting functional layer 720 emits light under the effect of the electrical field.

For example, as illustrated in FIG. 4, the light-emitting sub-elements included in the light-emitting element 700 are in one-to-one correspondence with the sub-pixel color filters. For example, the light emitted by the light-emitting element 700 is white light, and the white light passes through the pixel color filters of different colors located at the display side of the light-emitting element 700 to realize colored display.

For example, as illustrated in FIG. 4, the sensing region 103 located in the periphery region 102 is further provided with a light-emitting element as same as the light-emitting element 700 in the display region 101. The light-emitting element located in the sensing region 103 is not configured for display but for detecting a degree of attenuation of pixel when emitting light, and needs to be shielded by the frame color filter located in the periphery region 102.

In some examples, as illustrated in FIG. 4, the transparent base layer 100 is a film encapsulation layer, and the film encapsulation layer is located at a side of the first color filter layer 200 facing the light-emitting element 700.

For example, the transparent base layer 100 above is a first film encapsulation layer, and a side of the color filter structure away from the light-emitting element 700 is further provided with a second film encapsulation layer 100'; the first film encapsulation layer 100 and the second film encapsulation layer 100' can realize an effective encapsulation of the light-emitting element and an effective shield against moisture, oxygen and the like, so as to achieve the objective of protecting the light-emitting element and increasing the service life of the light-emitting element.

For example, a side of the second film encapsulation layer away from the color filter structure is further provided with a cover plate (not illustrated), the second film encapsulation layer and the cover plate are sequentially disposed on the color filter structure so as to protect the color filter structure. For example, the second film encapsulation layer is formed by one or more selected from organic materials or inorganic materials that have better sealing property, so as to achieve better sealing effect and to protect Si-based OLED display elements. For example, the cover plate may adopt a transparent material, for example, the transparent material may be an inorganic material such as glass or an organic material such as polyimide. For example, in the embodiment of the present disclosure, glass with high transmittance may be adopted, without particularly limited here.

The technical effect(s) of the LED display panel provided by the embodiments of the present disclosure may be referred to the technical effect(s) of the color filter structure provided by the embodiments of the present disclosure, without repeatedly described here.

Figure 5:
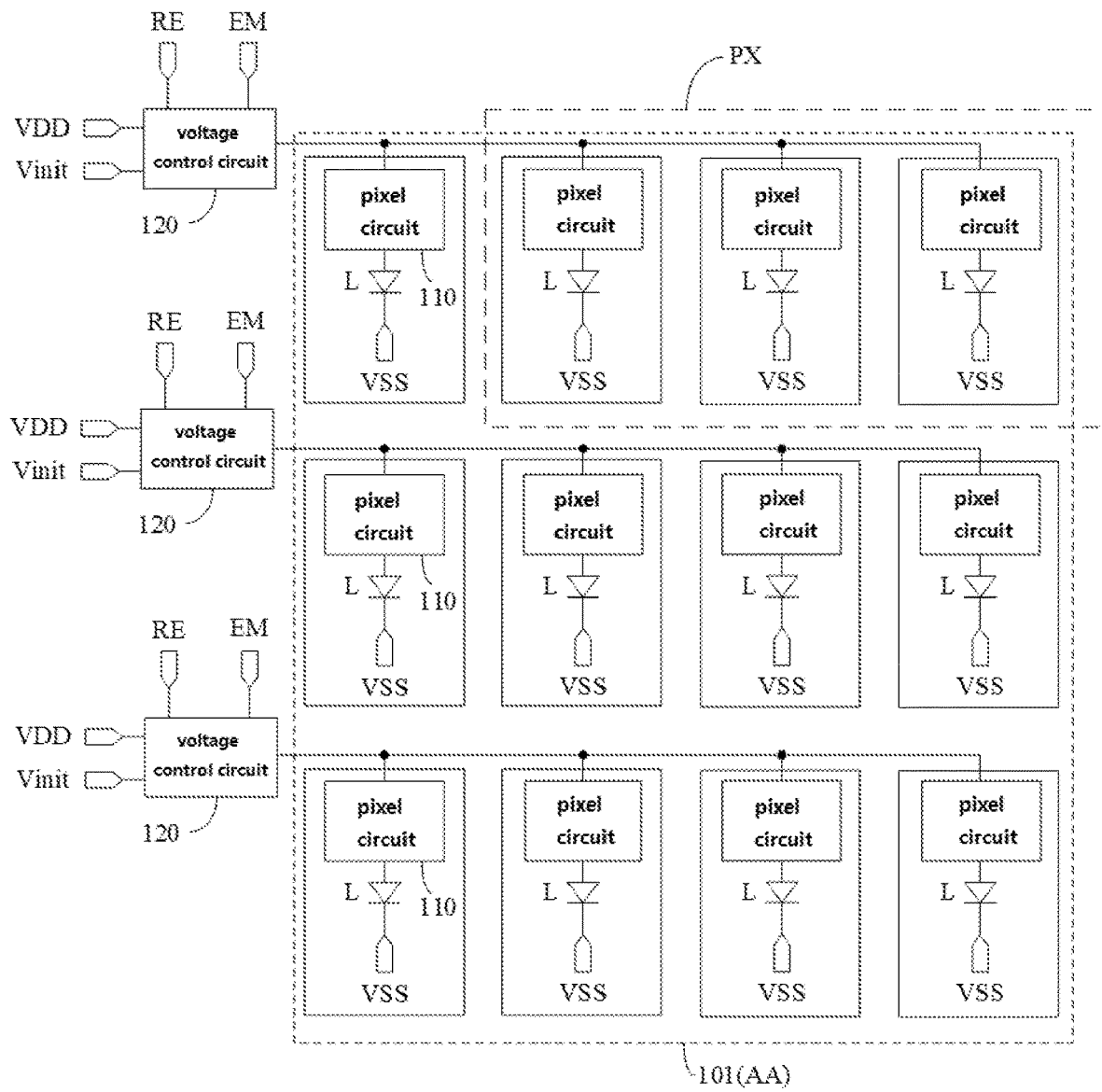
FIG. 5 is a schematic circuit diagram of a Si-based OLED display panel provided by an embodiment of the present disclosure.

FIG. 5 is a schematic circuit diagram of a Si-based OLED display panel provided by some embodiments of the present disclosure. The Si-based OLED display panel includes: a plurality of display elements L (i.e., light-emitting elements) located in the display region 101 (AA region), and pixel circuits 110 coupled with the plurality of display elements L in one-to-one correspondence; the pixel circuit 110 includes a driving transistor. Furthermore, the Si-based OLED display panel may further include a plurality of voltage control circuits 120 located in the periphery region 102 (a region in the Si-based OLED display panel except the display region 101) of the Si-based OLED display panel. For example, at least two pixel circuits 110 in one row share one voltage control circuit 120; first electrodes of driving transistors in one row of pixel circuits 110 are coupled to the shared voltage control circuit; and the second electrode of each of the driving transistors is coupled to the corresponding display element L. The voltage control circuit 120 is configured to output an initial signal Vinit to the first electrode of the driving transistor in response to a reset control signal RE, so as to control the corresponding display element L to reset; and is configured to output a first power source signal VDD to the first electrode of the driving transistor in response to a light-emitting control signal EM, so as to drive the display element L to emit light. By sharing the voltage control circuit 120, the structure of the pixel circuit in the display region 101 can be simplified, and an area occupied by the pixel circuit in the display region 101 can be reduced, so that the display region 101 may be provided with more pixel circuits and more display elements, thereby achieving an OLED display panel with high PPI. Moreover, the voltage control circuit 120 transmits the initial signal Vinit to the first electrode of the driving transistor under the control of the reset control signal RE so as to control the corresponding display element to reset, thereby preventing a voltage applied to the display element in a previous frame from affecting the illumination in the next frame, and hence mitigating the ghosting phenomenon.

For example, the Si-based OLED display panel may further include a plurality of pixel units PX located in the display region 101, each of the pixel units PX includes a plurality of sub-pixels; each of the sub-pixels includes one display element L and one pixel circuit 110. Further, the pixel unit PX may include three sub-pixels of different colors. These three sub-pixels may be a red sub-pixel, a green sub-pixel and a blue sub-pixel, respectively. Of course, the pixel unit PX may also include four, five or more sub-pixels, which may be determined according to actual application environments without limited here.

For example, pixel circuits 110 of at least two adjacent sub-pixels in a same row may share one voltage control circuit 120. For instance, in some examples, as illustrated in FIG. 5, all the pixel circuits 110 in a same row may share one voltage control circuit 120. Alternatively, in some other examples, adjacent two, three or more sub-pixels in a same row may share one voltage control circuit 120, without limited here. In this way, by sharing the voltage control circuit 120, the area occupied by the pixel circuit in the display region may be reduced.

FIG. 6 is a circuit diagram illustrating particular implementation of a voltage control circuit and a pixel circuit provided by some embodiments of the present disclosure. For example, a driving transister M0 in the pixel circuit 110 (i.e., the driver circuit 610 in FIG. 4) may be a N-type transistor. Furthermore, the light-emitting element L may include OLED. In this way, an anode of the OLED is electrically connected with a second electrode D of the driving transister M0, and a cathode of the OLED is electrically connected with a second power source end VSS. A voltage of the second power source end VSS is usually a negative voltage or a grounded voltage VGND (usually is 0V), and a voltage of the initial signal Vinit may also be configured as the grounded voltage VGND, without limited here. For example, the OELD may be configured as Micro-OLED or Mini-OLED, which further facilitates to achieve an OLED display panel with high PPI.

For example, as illustrated in FIG. 6, the voltage control circuit 120 may include a first switching transistor M1 and a second switching transistor M2; In addition to the driving transister M0, the pixel circuit 110 may further include a third switching transistor M3, a fourth switching transistor M4, a fifth switching transistor M5 and a storage capacitor Cst.

For example, as illustrated in FIG. 6, a gate electrode of the first switching transistor M1 is configured to receive the reset control signal RE, a first electrode of the first switching transistor M1 is configured to receive the initial signal Vinit, and a second electrode of the first switching transistor M1 is coupled with a first electrode of the third switching transistor M3. A gate electrode of the second switching transistor M2 is configured to receive the light-emitting control signal EM, a first electrode of the second switching transistor M2 is configured to receive the first power source signal VDD, and a second electrode of the second switching transistor M2 is coupled with a first electrode of the third switching transistor M3.

For example, the type of the first switching transistor M1 may be different from the type of the second switching transistor M2. For example, the first switching transistor M1 may be N-type transistor, while the second switching transistor M2 may be P-type transistor. Alternatively, the first switching transistor M1 may be P-type transistor, while the second switching transistor M2 may be N-type transistor. Of course, the type of the first switching transistor M1 may be as same as the type of the second switching transistor M2. In actual application, the type of the first switching transistor M1 and the type of the second switching transistor M2 may be designed according to actual application environment, without limited here.

For example, as illustrated in FIG. 6, a gate electrode of the third switching transistor M3 is configured to receive a control signal Vt; a first electrode of the third switching transistor M3 is coupled with the second electrode of the first switching transistor M1 and the second electrode of the second switching transistor M2, and is configured to receive the initial signal Vinit transmitted from the first switching transistor M1 or receive the first power source signal VDD transmitted from the second switching transistor M2; a second electrode of the third switching transistor M3 is coupled with a first electrode S of the driving transistor M0. For example, the third switching transistor M3 may be controlled to be turned on or turned off by controlling whether to input and transmit the control signal VT, so as to control the light-emitting time of the light-emitting element L, and hence to achieve pulse width modulation (PWM) dimming. Such controlling method facilitates to ensure the uniformity of PWM control of each sub-pixel.

For example, the pixel circuit 110 may further include a fourth switching transistor M4 and a storage capacitor Cst. For example, a gate electrode of the fourth switching transistor M4 is configured to receive a gate scanning signal SN, a first electrode of the fourth switching transistor M4 is configured to receive a data signal DATA, and a second electrode of the fourth switching transistor M4 is coupled with a gate electrode G of the driving transister M0. A first end of the storage capacitor Cst is coupled with the gate electrode G of the driving transister M0, and a second end of the storage capacitor Cst is coupled with a first voltage end V1. A voltage of the first voltage end V1 may be a grounded voltage VGND, embodiments of the present disclosure include such case but are not limited thereto. For example, the storage capacitor is configured to store the data signal DATA as written in, so that the driving transister M0 drives the light-emitting element L to emit light according to the data signal DATA as stored.

For example, the pixel circuit 110 may further include a fifth switching transistor M5. For example, a gate electrode of the fifth switching transistor M5 is configured to receive an inversion signal SN' of the gate scanning signal SN, a first electrode of the fifth switching transistor M5 is configured to receive the data signal DATA, and a second electrode of the fifth switching transistor M5 is coupled with the gate electrode G of the driving transister M0. Furthermore, the type of the fifth switching transistor M5 is different from that of the fourth switching transistor M4. For instance, in some examples, as illustrated in FIG. 6, the fourth switching transistor M4 is N-type transistor while the fifth switching transistor M5 is P-type transistor; alternatively, in some other examples, the fourth switching transistor M4 is P-type transistor while the fifth switching transistor M5 is N-type transistor.

It should be explained that, the pixel circuit structure in FIG. 6 is merely illustrated by way of example, and any other pixel circuit structures may be adopted in the embodiments of the present disclosure.

The driving transister M0, the first switching transistor M1, the second switching transistor M2, the third switching transistor M3, the fourth switching transistor M4 and the fifth switching transistor M5 as described above are MOS transistors manufactured in the base substrate 600 (e.g., Si-based substrate). For example, as least part of these transistors is located in the base substrate. For example, source regions and drain regions of these transistors are located in the base substrate 600.

Another embodiment of the present disclosure provides a LED display device including the above-described LED display panel. The LED display device provided by the embodiment of the present disclosure is a small-sized LED display device, i.e., micro-LED display device. The LED display device may be applied in any product or component having display function, such as television, digital camera, mobile phone, watch, tablet computer, notebook computer, navigation device and the like, and is especially applicable for helmet-mounted display, auto-stereoscopic display mirror, eyeglass display and the like. The above-described micro-LED display device may be coupled with mobile communication network, satellite positioning system and the like, so as to acquire precise image information anywhere and anytime.

The present embodiment is not limited thereto, and the LED display device provided by the embodiment of the present disclosure may also be applicable in virtual reality devices or augmented reality devices.

The technical effect(s) of the LED display device provided by the embodiments of the present disclosure may be referred to the technical effect(s) of the color filter structure provided by the embodiments of the present disclosure, without repeatedly described here.

Figure 7:
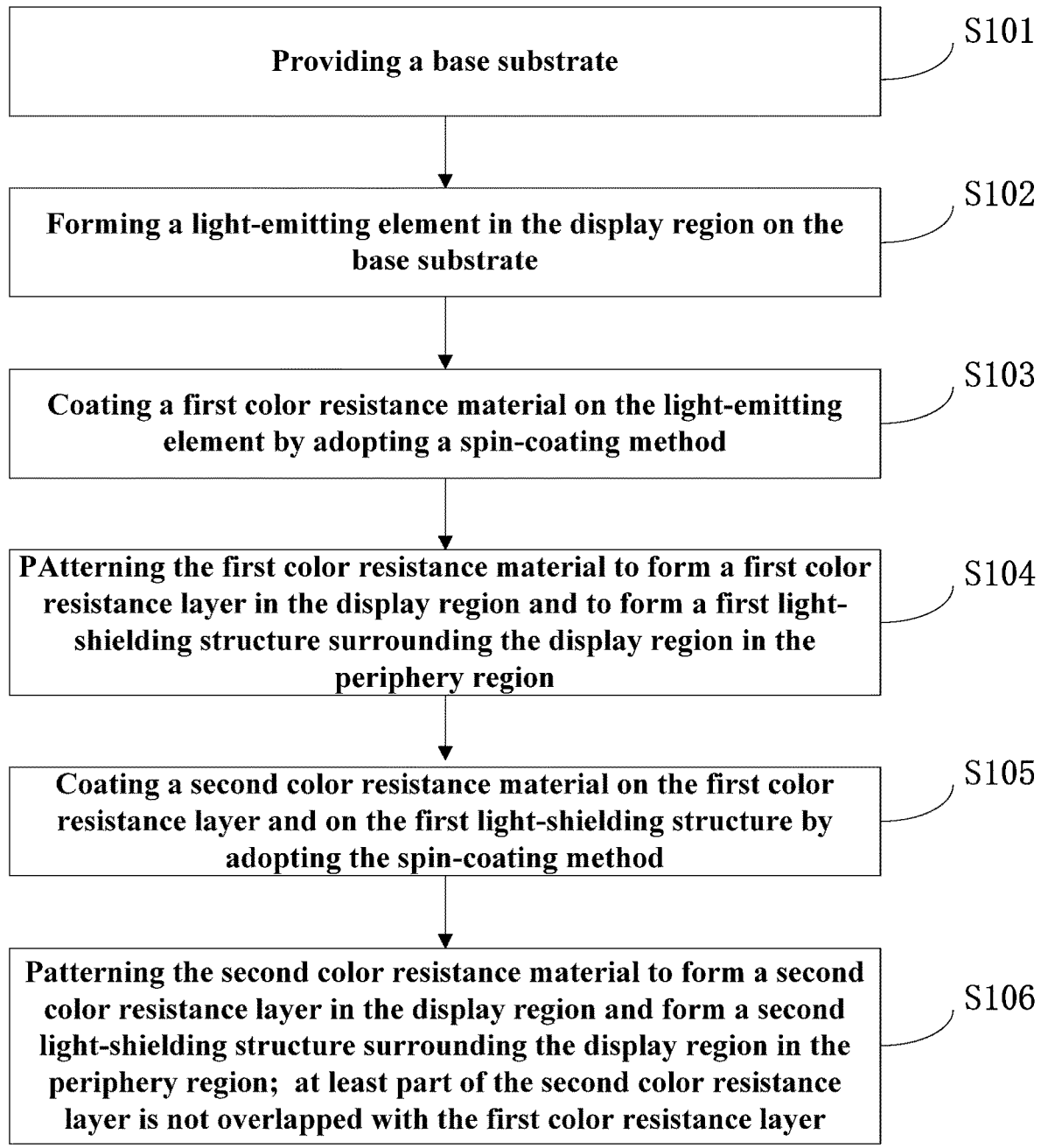
FIG. 7 is a flow chart of forming a LED display panel provided by an embodiment of the present disclosure.

Another embodiment of the present disclosure provides a manufacturing method of a LED display panel. FIG. 7 is a flow chart of a manufacturing method of a LED display panel provided by an embodiment of the present disclosure. Referring to FIGS. 2A-2H and FIGS. 4-7, the manufacturing method includes the following steps.

Step S101, providing a base substrate.

For example, as illustrated in FIG. 4, the base substrate 600 may be a Si-based substrate.

For example, as illustrated in FIG. 4, the base substrate 600 includes a display region 101 and a periphery region 102 surrounding the display region 101. The Si-based substrate 600 is integrated with a driver circuit 610, a gate driver circuit and a data driver circuit (not illustrated). The periphery region 102 of the Si-based substrate 600 may be provided with a flexible circuit board configured to transmit an electrical signal to the gate driver circuit, the data driver circuit or the like.

For example, the driver circuit 610 may adopt a pixel circuit of a circuit structure such as 4T1C, 4T2C, 7T1C, 8T2C and the like, and a driving method thereof may adopt conventional methods in the related art, without repeatedly described here. For example, the pixel circuit structure may be manufactured on the Si-based substrate by adopting a CMOS process, without particularly limited in the embodiments of the present disclosure.

Step S102, forming a light-emitting element in the display region on the base substrate.

For example, as illustrated in FIG. 4, forming the light-emitting element 700 includes forming a first electrode 710, a light-emitting functional layer 720 and a second electrode 730 that are sequentially laminated; the first electrode 710 is electrically connected with the driver circuit 610; the driver circuit 610 is configured to drive the light-emitting element 700 to emit light.

Step S103, coating a first color resistance material on the light-emitting element by adopting a spin-coating method.

For example, in the actual process, the Si-based substrate includes a plurality of LED display panel regions configured to form a plurality of LED display panels. After the light-emitting element is formed in each of the LED display panel regions, each of the LED display panel regions is covered by a first color filter material layer (i.e., the first color resistance material) which is coated by adopting a spin-coating method. Of course, the embodiments of the present disclosure are not limited to the spin-coating method, and other methods may also be adopted to coat the first color resistance material.

For example, the spin-coating method refers to a coating process in which drops of coating material fallen onto a working piece are dispersed onto the entire surface of the working piece by means of a centrifugal force generated by a rotation of the working piece and by means of an action of gravity. Coating a first color filter material layer by using the spin-coating method includes: dropping a first color filter material onto positions of the Si-based substrate except the LED display panel regions (e.g., dropping the color filter material onto a center of the entire Si-based substrate), and rotating the Si-based substrate to allow the first color filter material to be uniformly dispersed onto light-emitting elements in regions of the Si-based substrate, including all the LED display panel regions, so as to form the first color filter material layer having an uniform thickness.

For example, a coating speed as adopted may be different depending on the color of the first color filter material.

For example, before forming the first color filter material layer, the manufacturing method further includes: forming a transparent base layer on the light-emitting element, i.e., a film encapsulation layer to cover the light-emitting element.

Step S104, patterning the first color resistance material to form a first color resistance layer in the display region and form a first light-shielding structure surrounding the display region in the periphery region.

For example, as illustrated in FIG. 2A, after performing pre-baking, exposing, developing and post-baking to the first color filter material layer, a first pixel color filter 210 (i.e., first color resistance layer) may be formed in the display region 101, and a first frame color filter 220 (i.e., first light-shielding structure) may be formed in the periphery region 102. The first frame color filter 220 as formed is an annular-shaped color filter layer. For example, an outer contour of the first light-shielding structure may include a first side extending along a first direction and a second side extending along a second direction, the first direction is intersected with the second direction, the first side is connected with the second side through a cambered side, and the cambered side is curved towards a direction away from the display region. For example, both the first side and the second side are straight sides.

For example, an exposure intensity and an exposure time as adopted are different depending on the color of the first color filter material layer.

In some examples, forming the first light-shielding structure includes: patterning the first color resistance material to allow the outer contour of the first light-shielding structure to include a first side extending along a first direction and a second side extending along a second direction, wherein the first direction is intersected with the second direction, the first side is connected with the second side through a cambered side, and the cambered side is curved towards a direction away from the display region.

In the embodiment of the present disclosure, at least one angle of the outer annulus of the first frame color filter may be designed as a cambered side, so that in the subsequent process of forming other color filter layers, the probability that a color filter material dropped to the outside of the LED display panel regions (an outer side of the first frame color filter) presents a divergent shape during the spin-coating process due to an influence of the sharp angle of the outer frame of the first frame color filter is reduced, so as to allow the color filter layer coated in the display region to be more uniform, thereby preventing from the occurrence of non-uniform display in the display device including the color filter structure.

For example, the first pixel color filter and the first frame color filter as formed in the embodiment of the present disclosure possess characteristic(s) and technical effect(s) as same as those of the first pixel color filter and the first frame color filter illustrated in FIG. 2A and FIG. 2B, without repeatedly described here.

Step S105, coating a second color resistance material on the first color resistance layer and on the first light-shielding structure by adopting the spin-coating method.

In some examples, as illustrated in FIG. 2C and FIG. 2D, after forming the first pixel color filter and the first frame color filter, the manufacturing method further includes: coating a second color filter material layer (i.e., second color resistance material) on the first pixel color filter 210 and on the first frame color filter 220 by adopting a spin-coating method. Of course, the embodiments of the present disclosure are not limited to the spin-coating method, and other methods may also be adopted to coat the second color resistance material.

For example, dropping a second color filter material onto regions at an outer side of the first frame color filter 220, and rotating the Si-based substrate 600 to allow the second color filter material to be uniformly coated onto display regions 101 and periphery regions 102 of the LED display panel regions so as to form the second color filter material layer. When the angle of the outer annulus of the first frame color filter as formed is a rounded angle, during spin-coating the second color filter material, the second color filter material that is spin-coated onto the display regions of the LED display panel regions has relatively uniform thickness, so as to prevent from the occurrence of non-uniform display in the subsequent display period.

Step S106, patterning the second color resistance material to form a second color resistance layer in the display region and form a second light-shielding structure surrounding the display region in the periphery region, wherein at least part of the second color resistance layer is not overlapped with the first color resistance layer.

For example, as illustrated in FIG. 2C and FIG. 2D, after coating a second color filter material layer, patterning the second color filter material layer, for example, exposing and developing the second color filter material layer so as to form a second pixel color filter 310 (i.e., second color resistance layer) in the display region 101, and to form an annular-shaped second frame color filter 320 (i.e., second light-shielding structure) surrounding the display region 101 on the first frame color filter 220, wherein at least part of the second pixel color filter 310 is not overlapped with the first pixel color filter 210.

Forming the second light-shielding structure includes: patterning the second color resistance material, so that in a direction perpendicular to an extension direction of the first light-shielding structure, a width of the second light-shielding structure is smaller than a width of the first light-shielding structure so as to form a stepped structure.

Compared to the case where the size of the first frame color filter is exactly the same with the size of the second frame color filter, in the embodiment of the present disclosure, the width of the second frame color filter is formed to be smaller than the width of the first frame color filter so as to form a stepped structure, which can facilitate the flow of the color filter material during the process of forming subsequent color filter layers by using a spin-coating method, thereby further improving the uniformity of the pixel color filters formed in the display region and preventing from the occurrence of non-uniform display during the subsequent display period.

For example, the above-mentioned stepped structure may be located at a side of the second frame color filter close to the display region, and may also be located at a side of the second frame color filter away from the display region. Alternatively, the above-mentioned stepped structure may be provided at both the side of the second frame color filter close to the display region and the side of the second frame color filter away from the display region so as to be advantageous for the uniformity of the pixel color filter subsequently formed in the display region. The second pixel color filter formed by the manufacturing method provided by the embodiment of the present disclosure possesses the characteristic(s) and technical effect(s) as same as those of the second pixel color filter illustrated in FIG. 2C and FIG. 2D, without repeatedly described here.

For example, as illustrated in FIG. 2C and FIG. 2D, the shape of the second frame color filter 320 formed on the first frame color filter 220 may be as same as the shape of the first frame color filter 220. For example, the angle of the outer annulus of the second frame color filter 320 may also be a rounded angle, so that during the process of forming subsequent color filter layers by adopting the spin-coating method, the color filter layer spin-coated in the display region has better uniformity.

In some examples, as illustrated in FIG. 2E and FIG. 2F, after forming the second pixel color filter and the second frame color filter, the manufacturing method further includes: coating a third color filter material layer on the second pixel color filter 310 and on the second frame color filter 320 by adopting a spin-coating method.

For example, dropping a third color filter material (i.e., third color resistance material) onto regions at an outer side of the second frame color filter 320, and rotating the Si-based substrate 600 to allow the third color filter material to be uniformly coated onto display regions 101 and periphery regions 102 of the LED display panel regions so as to form the third color filter material layer. Because the angle of the outer annulus of the first frame color filter and the angle of the outer annulus of the second frame color filter as formed are rounded angles, and because the first frame color filter and the second frame color filter form a stepped structure, during spin-coating the third color filter material, the third color filter material that is spin-coated onto the display regions of the LED display panel regions has relatively uniform thickness, so as to prevent from the occurrence of non-uniform display in the subsequent display period.

For example, as illustrated in FIG. 2E and FIG. 2F, after coating a third color filter material layer, patterning the third color filter material layer, for example, exposing and developing the third color filter material layer so as to form a third pixel color filter 410 (i.e., third color resistance layer) in the display region 101, and to form a third frame color filter 420 (i.e., third light-shielding structure) surrounding the display region 101 on the second frame color filter 320, wherein at least part of the third pixel color filter 410 is not overlapped with the first pixel color filter 210 and the second pixel color filter 310.

For example, the third pixel color filter and the third frame color filter as formed in the present embodiment possess characteristic(s) and technical effect(s) as same as those of the third pixel color filter and the third frame color filter illustrated in FIG. 2E and FIG. 2F, without repeatedly described here. Of course, the third pixel color filter and the third frame color filter as formed in the present embodiment may also possess characteristic(s) and technical effect(s) as same as those of the third pixel color filter and the third frame color filter illustrated in FIG. 2G and FIG. 2H, without repeatedly described here.

Another example of the present embodiment provides a manufacturing method of a LED display panel. Referring to FIGS. 3A-3E, the manufacturing method of the present example is different from the manufacturing method provided by the previous example in that, before forming the first color filter material layer, it further includes: coating a fourth color filter material layer on the light-emitting element by adopting a spin-coating method, and patterning the fourth color filter material layer to only form a fourth pixel color filter 510 in the display region 101. The fourth color filter material layer in the present example and the third color filer material layer in the previous example are color filter material layers of the same color, with the difference that, the fourth color filter material layer in the present example is formed prior to the first color filter layer, and the periphery region only includes two color filter layers which are the first frame color filter and the second frame color filter. Of course, the embodiments of the present disclosure are not limited thereto, and the fourth color filter material layer may also be a color filter material layer having a color different from that of the third color filter material layer in the previous example.

For example, dropping a fourth color filter material onto positions of the Si-based substrate except the LED display panel regions, and rotating the Si-based substrate to allow the fourth color filter material to be uniformly dispersed onto light-emitting elements in the plurality of LED display panel regions so as to form a fourth color filter material layer with uniform thickness. Then pre-baking, exposing, developing and post-baking the fourth color filter material layer so as to only form the fourth pixel color filter in the display region.

For example, after forming the fourth pixel color filter, coating a first color filter material layer on the fourth pixel color filter by adopting a spin-coating method. That is, dropping a first color filter material onto positions of the Si-based substrate except the LED display panel regions, and rotating the Si-based substrate to allow the first color filter material to be uniformly dispersed onto display regions and periphery regions (including the fourth pixel color filter) of the plurality of LED display panel regions so as to form a first color filter material layer with uniform thickness. Then patterning the first color filter material layer to form a first pixel color filter in the display region and to form a first frame color filter surrounding the display region in the periphery region, wherein at least part of the first pixel color filter is not overlapped with the fourth pixel color filter. The first pixel color filter and the first frame color filter formed in the present example possess the same characteristic(s) and the same technical effect(s) with those of the first pixel color filter and the first frame color filter formed by the manufacturing method provided in the previous example, without repeatedly described here.

For example, in the manufacturing method provided by the present example, after forming the first pixel color filter and the first frame color filter, the second pixel color filter as formed has the same characteristic(s) and the same technical effect(s) with those of the second pixel color filter formed in the previous example, without repeatedly described here.

For example, the second frame color filter formed by the manufacturing method provided by the present example not only needs to have a same shape with that of the first frame color filter but also needs to have an orthographic projection on the transparent base layer to be at least completely coincident with an orthographic projection of the first frame color filter on the transparent base layer, so as to serve for light shielding together with the first frame color filter.

For example, after forming the color filter structure, the manufacturing method provided by the embodiments of the present disclosure further includes: forming a film encapsulation layer at a side of the color filter structure away from the light-emitting element. Two film encapsulation layers located at both sides of the color filter structure, respectively, can realize an effective encapsulation of the light-emitting element and realize an effective shield against moisture, oxygen and the like, thereby achieving the objective of protecting the light-emitting element and increasing the service life of the light-emitting element.

For example, both of the two film encapsulation layers may be formed by one or more selected from organic materials or inorganic materials that have better sealing property, so as to achieve better sealing effect and to protect Si-based OLED display elements.

For example, after forming a film encapsulation layer at a side of the color filter structure away from the light-emitting element, the manufacturing method further includes: forming a cover plate at a side of the film encapsulation layer away from the color filter structure to protect the color filter structure.

For example, the cover plate may adopt a transparent material, for example, the transparent material may be an inorganic material such as glass or an organic material such as polyimide. For example, in the embodiment of the present disclosure, a mother glass with high transmittance may be adopted, without particularly limited here.

The technical effect(s) of the LED display panel obtained by the manufacturing method provided by the embodiments of the present disclosure may be referred to the technical effect(s) of the color filter structure provided by the embodiments of the present disclosure, without particularly limited here.

The following statements should be noted:

(1) The drawings accompanying the embodiments of the present disclosure involve only the structure(s) in connection with the embodiment(s) of the present disclosure, and other structure(s) can be referred to common design(s).

(2) In case of no conflict, the features in the same embodiment or in different embodiments can be combined with each other.

What have been described above are only specific implementations of the present disclosure, the protection scope of the present disclosure is not limited thereto. The protection scope of the present disclosure should be based on the protection scope of the claims.

What is claimed is:

1. A light-emitting diode (LED) display panel, comprising:
   a base substrate, comprising a display region and a periphery region surrounding the display region;
   a plurality of sub-pixels, located in the display region and located at a side of the base substrate, at least one sub-pixel of the plurality of sub-pixels comprising:
   a light-emitting element, comprising a first electrode, a light-emitting functional layer, and a second electrode that are sequentially laminated, the first electrode being closer to the base substrate as compared to the second electrode; and
   a driver circuit, located between the light-emitting element and the base substrate, the driver circuit comprising a driving transistor and a storage capacitor, the driving transistor comprising a source electrode, a drain electrode, and a gate electrode, one of the source electrode and the drain electrode being coupled with the first electrode, the gate electrode being coupled with the storage capacitor, and the storage capacitor being configured to store a digital signal;
   the LED display panel further comprising:
   color resistance layers, located at a side of the second electrode away from the base substrate, light emitted from the light-emitting element exiting through the color resistance layers; and
   a light-shielding structure, located in the periphery region and having an annular structure surrounding the plurality of sub-pixels, wherein
   the light-shielding structure comprises a first light-shielding structure and a second light-shielding structure, the second light-shielding structure is located at a side of the first light-shielding structure away from the base substrate, a second orthographic projection of the second light-shielding structure on the base substrate is located within a first orthographic projection of the first light-shielding structure on the base substrate, and the first orthographic projection is not completely coincident with the second orthographic projection,
   wherein both an inner edge and an outer edge of the first light-shielding structure are not covered by the second light-shielding structure,
   wherein the light-shielding structure further comprises a third light-shielding structure, the third light-shielding structure is located at a side of the second light-shielding structure away from the first light-shielding structure,
   wherein an orthographic projection of the third light-shielding structure on the base substrate is completely coincident with the first orthographic projection, or, the orthographic projection of the third light-shielding structure on the base substrate is located within the second orthographic projection.

2. The LED display panel according to claim 1, wherein an outer contour of the first light-shielding structure comprises a first side extending along a first direction and a second side extending along a second direction, the first direction is intersected with the second direction, the first side is connected with the second side through a cambered side, and the cambered side is curved towards a direction away from the display region.

3. The LED display panel according to claim 2, wherein the cambered side comprises a rounded angle, and the outer contour of the first light-shielding structure is a rectangle with rounded angles.

4. The LED display panel according to claim 3, wherein a circle comprising the cambered side is tangent with the first side or the second side.

5. The LED display panel according to claim 1, wherein a shape of the first light-shielding structure is a closed annulus, and/or, a shape of the second light-shielding structure is a closed annulus.

6. The LED display panel according to claim 1, wherein a shape of the second light-shielding structure is the same as a shape of the first light-shielding structure, and an area of the second orthographic projection is smaller than an area of the first orthographic projection.

7. The LED display panel according to claim 1, wherein the color resistance layer comprises a plurality of color resistance sub-layers, the plurality of color resistance sub-layers are in one-to-one correspondence with the plurality of sub-pixels, at least part of adjacent ones of the plurality of color resistance sub-layers are not overlapped with each other, the plurality of color resistance sub-layers comprise a plurality of first color resistance sub-layers, and the plurality of first color resistance sub-layers and the first light-shielding structure are located in a same layer and are made of a same material.

8. The LED display panel according to claim 7, wherein the plurality of color resistance sub-layers further comprise a plurality of second color resistance sub-layers, the plurality of second color resistance sub-layers and the second light-shielding structure are located in a same layer and are made of a same material.

9. The LED display panel according to claim 8, wherein the plurality of color resistance sub-layers further comprise a plurality of third color resistance sub-layers, the plurality of third color resistance sub-layers and the third light-shielding structure are located in a same layer and are made of a same material.

10. The LED display panel according to claim 9, wherein the first color resistance sub-layer, the second color resistance sub-layer, and the third color resistance sub-layer are color filter layers of different colors.

11. The LED display panel according to claim 1, wherein the light-shielding structure covers part of the second electrode.

12. The LED display panel according to claim 1, further comprising:
a sensing region located in the periphery region, wherein an orthographic projection of the sensing region on the base substrate is located within the first orthographic projection.

13. The LED display panel according to claim 1, wherein a side of the color resistance layer facing the base substrate is provided with a first film encapsulation layer, and a side of the color resistance layer away from the base substrate is provided with a second film encapsulation layer.

14. A manufacturing method of the LED display panel according to claim 1, comprising:
providing the base substrate;
forming the light-emitting element in the display region on the base substrate;
coating a first color resistance material on the light-emitting element;
patterning the first color resistance material to form a first color resistance layer in the display region and form the first light-shielding structure surrounding the display region in the periphery region;
coating a second color resistance material on the first color resistance layer and on the first light-shielding structure; and
patterning the second color resistance material to form a second color resistance layer in the display region and form the second light-shielding structure surrounding the display region in the periphery region, at least part of the second color resistance layer being not overlapped with the first color resistance layer, wherein
forming the second light-shielding structure comprises: patterning the second color resistance material to allow the second orthographic projection to be located within the first orthographic projection and to allow the first orthographic projection to be not completely coincident with the second orthographic projection.

15. The manufacturing method according to claim 14, wherein forming the first light-shielding structure comprises:
patterning the first color resistance material to allow an outer contour of the first light-shielding structure to comprise a first side extending along a first direction and a second side extending along a second direction, wherein the first direction is intersected with the second direction, the first side is connected with the second side through a cambered side, and the cambered side is curved towards a direction away from the display region.

16. An organic light-emitting diode (OLED) display device, comprising the LED display panel according to claim 1.

* * * * *